United States Patent [19]
Terui

[11] Patent Number: 5,890,251
[45] Date of Patent: Apr. 6, 1999

[54] METHOD AND APPARATUS FOR SCRUBBING WORK IN RUNNING WASH LIQUID

[75] Inventor: Yoshinobu Terui, Ayase, Japan

[73] Assignee: Speedfam Clean System Co., Ltd., Ayase, Japan

[21] Appl. No.: 980,120

[22] Filed: Nov. 26, 1997

Related U.S. Application Data

[62] Division of Ser. No. 777,070, Dec. 30, 1996.

[30] Foreign Application Priority Data

May 9, 1996 [JP] Japan ................................. 8-139645

[51] Int. Cl.⁶ ................................................. A47L 25/00
[52] U.S. Cl. ............................................ 15/88.2; 15/102
[58] Field of Search ...................... 15/61, 64, 77, 15/88.1, 88.2, 88.3, 88.4, 102

[56] References Cited

U.S. PATENT DOCUMENTS

| | | | |
|---|---|---|---|
| 748,584 | 1/1904 | Clifford | 15/61 |
| 1,316,641 | 9/1919 | Perkins | 15/64 |
| 4,475,259 | 10/1984 | Ishii | 15/102 |
| 5,528,788 | 6/1996 | Yamamoto | 15/77 |
| 5,621,939 | 4/1997 | Yoshida | 15/102 |
| 5,694,657 | 12/1997 | Yoshida | 15/77 |

FOREIGN PATENT DOCUMENTS

| | | | |
|---|---|---|---|
| 118556 | 5/1944 | Australia | 15/88.3 |
| 256275 | 2/1913 | Germany | 15/64 |

*Primary Examiner*—Randall E. Chin
*Attorney, Agent, or Firm*—Oblon, Spivak, McClelland, Maier & Neustadt, P.C.

[57] ABSTRACT

Method and apparatus for scrubbing flat disc-like work pieces in a running wash liquid, by the use of a wash liquid flow vessel 2 maintaining a continuous flow of a wash liquid in one direction, a work carrier 18 for holding a plural number of work pieces 4 in an immersed state and in parallel relation with the flow direction of the wash liquid, a slidable carriage 28 for transferring the work carrier 18 in a direction reverse to the flow direction of the wash liquid, and a scrubber means 20 having scrubbing brushes 38 for washing and scrubbing the work pieces 4 on the carrier 18 in an immersed state in the flow of the wash liquid.

6 Claims, 4 Drawing Sheets

METHOD AND APPARATUS FOR SCRUBBING WORK IN RUNNING WASH LIQUID

This is a Division of application Ser. No. 08/777,070 filed Dec. 30, 1996, now pending.

BACKGROUND OF THE INVENTION

1. Field of the Art

This invention relates to method and apparatus for scrubbing work in a running wash liquid, especially suitable for washing and scrubbing articles of substantially flat disc-like shapes such as magnetic disc substrates including glass substrates and other ceramic substrates, and various electronic, optical or mechanical parts of such shapes.

2. Prior Art

Scrubbers which are arranged to wash work of flat shapes like magnetic disc substrates by the use of scrubbing brushes have been known in the art, for example, from Japanese Laid-Open Patent Specification S61-8734 and Japanese Utility Model Publication H4-22411.

Generally, prior art scrubbers of this sort are provided with spray nozzles thereby to spray a shower of wash liquid on work pieces while being washed and scrubbed by the scrubbing brushes.

Washing work pieces in a shower of a wash liquid which is sprayed from a spray nozzle or nozzles is effective as long as contamination of work is relatively light and of such a degree as would not require supply of a large amount of wash liquid. However, a wash liquid spray nozzle or nozzles of this sort normally can spray only a limited amount of wash liquid and therefore are not necessarily suitable for use in scrubbing relatively heavily contaminated articles which need a large amount of wash liquid supply to wash away deposited contaminants in an assured manner without permitting once removed contaminants to re-deposit on scrubbing brushes, as in the case of buffing work pieces which still bear abrasive powder or other foreign matter deposited in an immediately preceding machining operation or operations.

Besides, the wash liquid spray nozzles have to be enclosed in a hood or other splash guard means in order to block splashes of the wash liquid which tend to scatter around a scrubbing apparatus considerably especially in a case where a large amount of wash liquid is spurted and hit against work pieces at a high velocity.

SUMMARY OF THE INVENTION

It is a primary object of the present invention to provide method and apparatus for scrubbing work in running wash liquid, which can produce excellent cleaning effects by supply of a sufficient amount of wash liquid for scrubbing off contaminants to a satisfactory degree and for washing away once-removed contaminants in an assured manner.

It is another object of the present invention to provide scrubbing method and apparatus capable of splash-free clean scrubbing operations precluding the problem of wash liquid splashes scattering in surrounding areas.

In accordance with the present invention, the above-stated objectives are achieved by the provision of a method for scrubbing work pieces of flat plate-like shape in a running wash liquid, the scrubbing method including: feeding a wash liquid to one end of a channel-like flow vessel and letting the wash liquid flow continuously in one direction toward the other end of the vessel; submerging the work pieces in the wash liquid in parallel relation with the flow direction of the wash liquid; and scrubbing faces of the work pieces with rotating brushes in an immersed state in the wash liquid.

In one specific form of the present invention, the scrubbing method includes the steps of: supporting a plural number of work pieces in the form of circular discs on a work carrier means rotatably for rotations about the respective axes; and scrubbing the work pieces in a totally submerged state in the flow of the wash liquid with a plural number of scrubber brushes in the form of circular discs disposed in parallel relation with the work pieces and the flow direction of the wash liquid.

Thus, according to the present invention, work pieces are scrubbed in a totally submerged state in the wash liquid continuously flowing through the flow vessel, constantly supplying a sufficient amount of wash liquid for scrubbing off and washing away contaminants to a satisfactory degree while preventing re-deposition of once-removed contaminants on the work pieces or on the scrubbing brushes.

Besides, the method of the present invention ensures splash-free clean and safe scrubbing operations without using a hood or splash guard means which would otherwise be required to prevent contamination of working environments by splashes of a wash liquid.

According to the present invention, there is also provided an apparatus for scrubbing flat plate-like work pieces in a running wash liquid, which includes: a channel-like wash liquid flow vessel for maintaining a flow of wash liquid in one direction; a work holder means for holding the work pieces in an immersed state in the flow vessel in parallel relation with the flow direction of the wash liquid; and a scrubber means located in a predetermined position on the flow vessel and provided with scrubbing brushes to scrub the work pieces in an immersed state in the flow of the wash liquid.

In a more specific form of the invention, the scrubbing apparatus includes a work holder means which is arranged to hold a plural number of circular disc-like work pieces rotatably about the respective axes, and a plural number of disc-like scrubbing brushes disposed in parallel relation with the work pieces and the flow direction of the wash liquid.

Preferably, the wash liquid is flown horizontally through the flow vessel, and the work holder means is provided with a counterflow transfer means to transfer the work pieces through the flow vessel in a direction reverse to the flow direction of the wash liquid.

In accordance with the present invention, there is further provided an apparatus for scrubbing flat disc-like work pieces in a running wash liquid, the apparatus including: a wash liquid flow vessel for maintaining a continuous flow of wash liquid horizontally in one direction; a first work holder carrier movable back and forth in and along the length of the flow vessel and arranged to hold a plural number of circular disc-like work pieces rotatably about the respective axes and in parallel relation with the flow direction of the wash liquid; a counterflow transfer means for transferring the first carrier and the work pieces within the flow vessel in a direction reverse to the flow direction of the wash liquid; a scrubber means located in an intermediate position on the flow vessel and provided with a brush holder having a plural number of circular disc-like scrubbing brushes in uniformly spaced positions in a transverse direction to scrub the work pieces on the first carrier in the flow of the wash liquid; a work feeder means located at a loading station downstream of the scrubber means for feeding unwashed work pieces to the first carrier means; and an ejector means located at an unloading station upstream of the scrubber means to eject washed work pieces from the first carrier means.

In a preferred form of the invention, the first carrier means is provided with a plural number of transversely extending parallel work holder rods rotatably supported in vertically staggered positions and each formed with circumferential grooves at uniform intervals in the transverse direction to hold the work pieces in upright and uniformly spaced positions by engagement with outer peripheries of the work pieces at a number of different angular positions, and the work feeder means and the work ejector means are constituted by one and common second carrier having a plural number of transversely extending parallel work holder rods each formed with a plural number of circumferential grooves at uniform intervals in the transverse direction to hold a number of work pieces in upright positions by engagement with outer peripheries of the work pieces at a number of shifted angular positions relative to the work holder rods of the first carrier, the second carrier being movable toward and away from the first carrier and arranged to load unwashed work pieces onto the work holder rods of the first carrier when engaged therewith in an overlapped state and to eject washed work pieces on the work holder rods of the first carrier when disengaged therefrom.

In this case, a number unwashed work pieces on the second carrier are automatically transferred onto and rotatably supported by the work holder rods of the first carrier simply by lowering the second carrier into an overlapping position on the first carrier at the work loading station.

The two overlapped carriers are transferred toward the unloading station on the upstream side of the flow vessel and, on the way, the work pieces on the first carrier are washed and scrubbed with the brushes of the scrubber means at an intermediate position of the flow vessel. As soon as the two carriers reach the unloading station, the second carrier alone is lifted up, whereupon the washed work pieces on the work holder rods of the first carrier are automatically transferred onto the work holder rods of the second carrier and thereby ejected from the flow vessel.

If desired, an ultrasonic radiation means may be provided on the flow vessel to apply ultrasonic waves on the work pieces being scrubbed.

BRIEF DESCRIPTION OF THE DRAWINGS

The above and other objects, features and advantages of the invention will become apparent from the following description, taken in conjunction with the accompanying drawings which show by way of example a preferred embodiment of the invention and in which.

DESCRIPTION OF PREFERRED EMBODIMENTS

Hereafter, the invention is described more particularly by way of its preferred embodiments with reference to the accompanying drawings.

Figure 1:
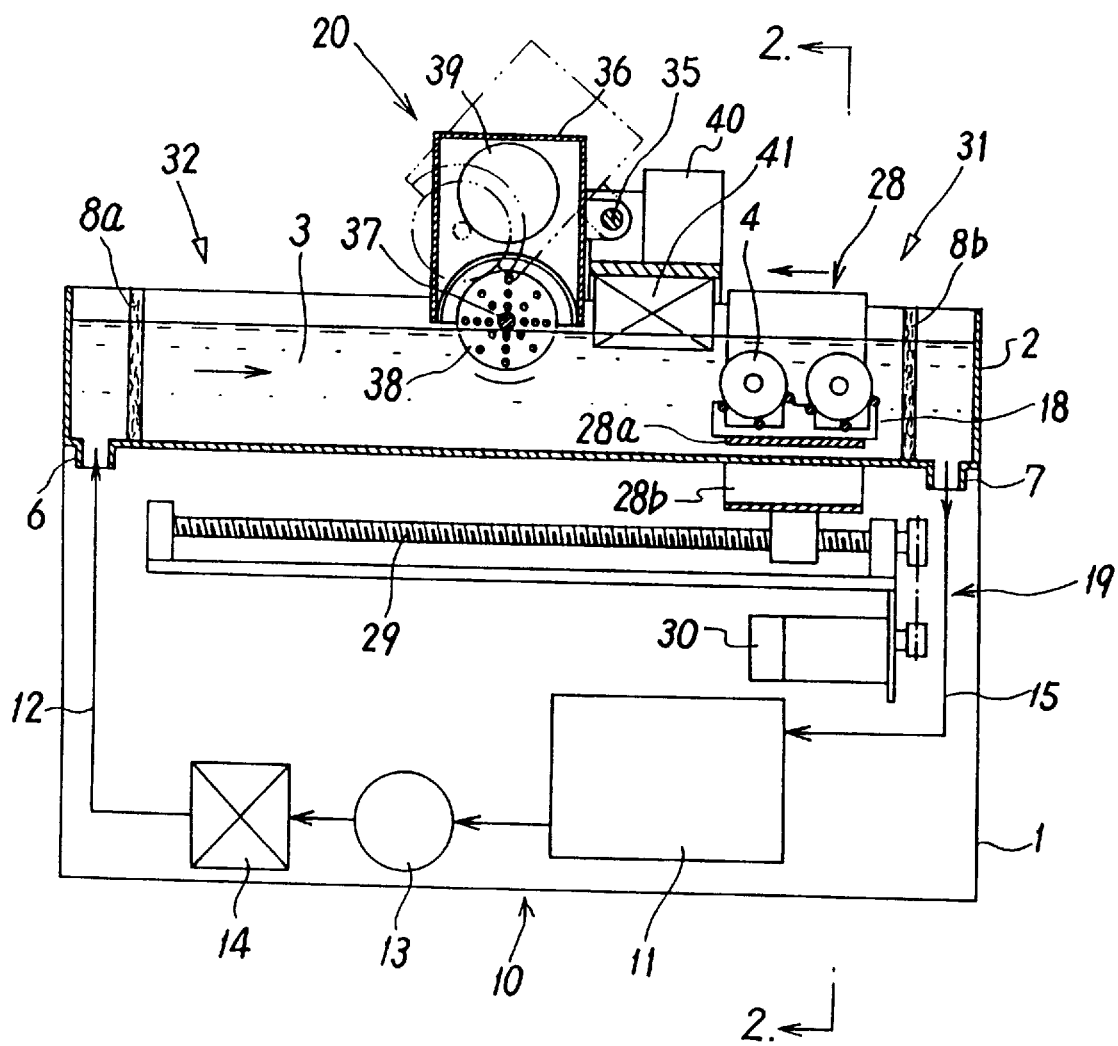
FIG. 1 is a vertically sectioned side view of a scrubber embodying the present invention.
Figure 2:
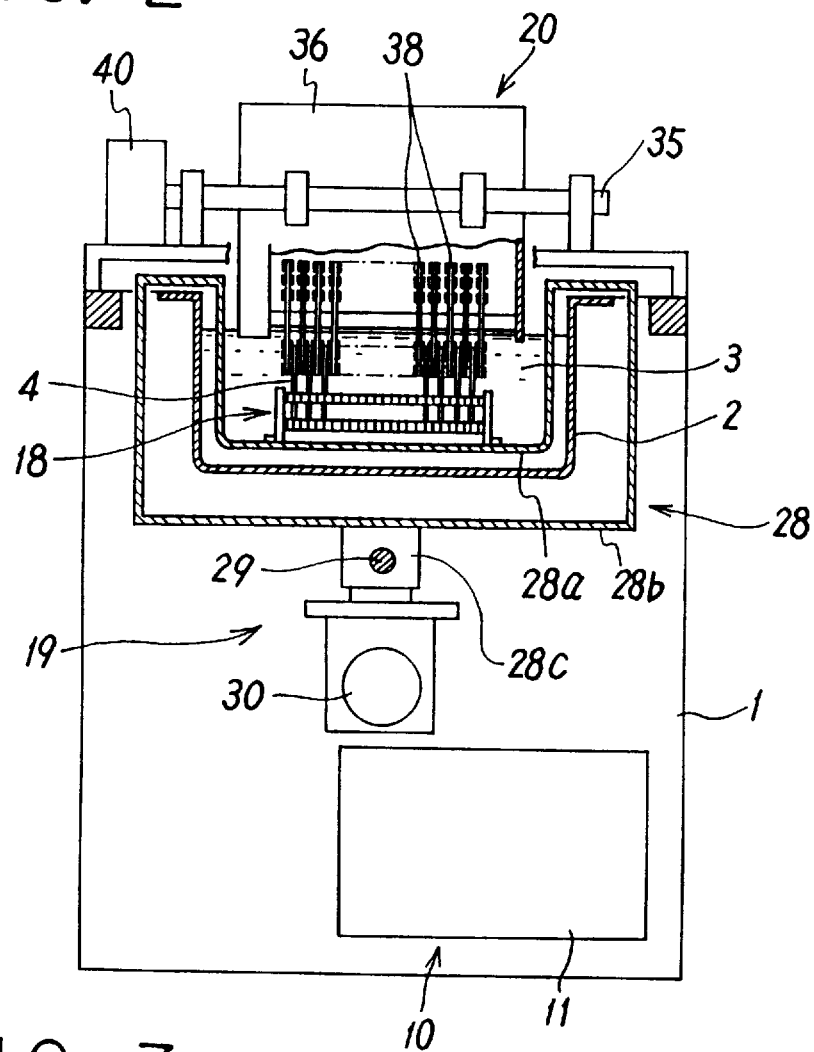
FIG. 2 is a schematic sectional view taken on line II—II of FIG. 1.

Shown in FIGS. 1 and 2 is a scrubbing apparatus employing a wash liquid flow vessel 2 to scrub work pieces in a running wash liquid according to the invention, the flow vessel 2 being mounted on top of a machine frame 1.

In the particular embodiment shown, the wash liquid flow vessel 2 is formed substantially in a channel-like shape in cross section to maintain a continuous flow of wash liquid such as water, detergent or other chemical cleaning solutions horizontally in one direction, for example, from the left to right end of the flow vessel in FIG. 1 to scrub and wash a number of work pieces 4 in a submerged state in the flow of the wash liquid. The wash liquid flow vessel 4 is provided with, at its upstream end, a wash liquid inlet port 6 and a filter 8a for a wash liquid 3 entering the flow vessel 2 and, at its downstream end, a wash discharge port 7 and a filter 8b for the wash liquid 3 leaving the flow vessel 2. The wash inlet port 6 and discharge port 7 are connected to a wash liquid feed means 10.

The wash liquid feed means 10 is provided with a feed liquid reservoir tank 11, a pump 13 for sending the wash liquid from the tank 11 to the afore-mentioned inlet port 6 under pressure, and a filter 14 provided in a passage 12 to the wash inlet port 6 for filtration of the wash liquid 3 from the pump 13. In this embodiment, the wash liquid 3 which comes out through the wash discharge port 7 through passage 15 is recovered in the reservoir tank 11 and cleaned by filtration before being recycled to the wash liquid flow vessel 2. However, instead of the cyclic use of the wash liquid, the wash liquid feed means may be arranged to supply fresh wash liquid constantly to the flow vessel 2 from a wash liquid source which is not shown.

In order to hold a plural number of circular and flat disc-like work pieces in a submerged state in the flow of the wash liquid in the flow vessel 2 and rotatably about the respective axes, the scrubbing apparatus is provided with a first work carrier 18, in association with a transfer means 19 which move the first carrier 18 in a counterflow direction relative to the flow of the wash liquid 3, and a scrubber means 20 which washes and scrubs a number of work pieces 4 on the carrier 18 in the flow of the wash liquid.

Figure 3:
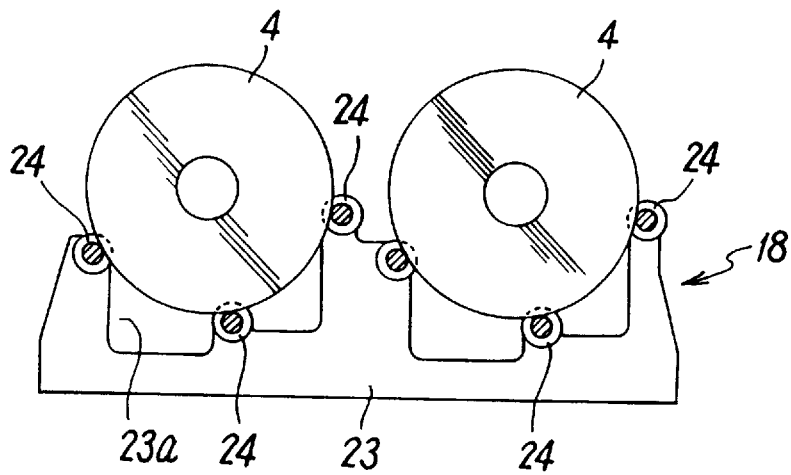
FIG. 3 is a schematic sectional view of a first work carrier.
Figure 4:
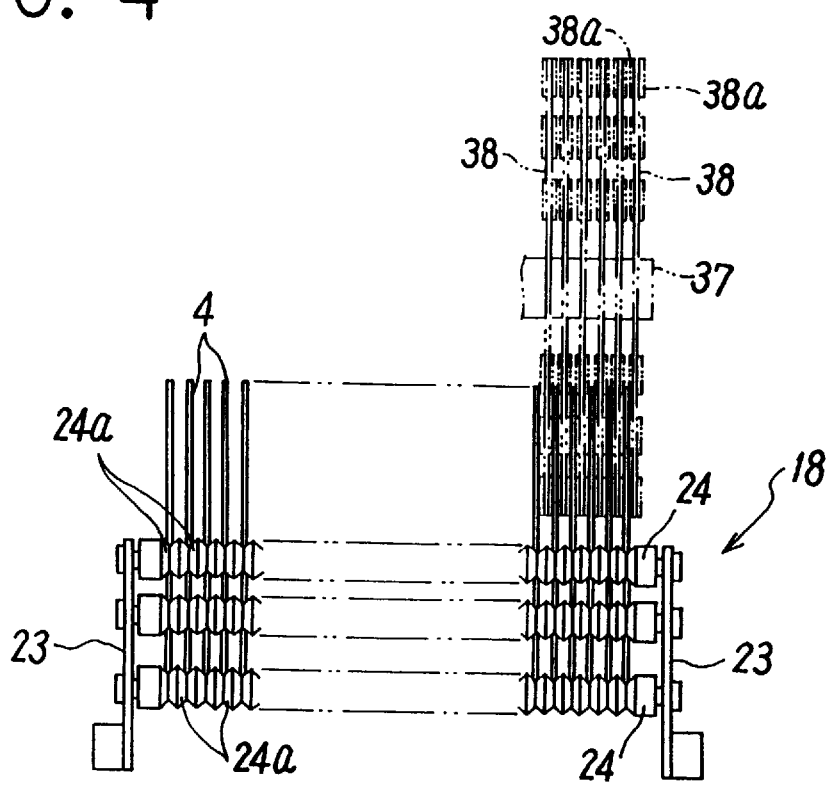
FIG. 4 is a schematic side view on an enlarged scale of the first carrier shown in FIG. 3.

As shown in FIGS. 3 and 4, the first work carrier 18 includes a pair of opposingly positioned frames 23, and a plural number of transverse work holder rods 24 (three holder rods being used as one set in the particular embodiment shown) which are rotatably supported between the frames 23 in parallel relation with each other in the transverse direction of the flow vessel 2 and in vertically staggered positions concentric with outer peripheries of work pieces 4. Each work holder rod 24 is circumferentially formed with a plural number of grooves 24a at predetermined intervals along its length for engagement with circumferential edges of the work pieces 4. Accordingly, the respective work pieces 4 are supported in upright positions at a number of different points of the respective outer peripheries by engagement with the circumferential grooves 24a on a set of work holder rods 24.

Preferably, the above-described first work carrier 18 is formed of a heat- and chemical-resistant material.

In the particular embodiment shown, two sets of work holder rods 24 are provided on the front and rear sides of the carrier to support a large number of work pieces 4 in two front and rear rows. If desired, only one set or more than two sets of work holder rods 24 may be provided on the first work carrier 18.

The transfer means 19, which serves to move the first carrier 18 back and forth in and along the flow vessel 2, includes a slidable carriage 28, a screw rod 29 which feeds the slidable carriage 28, and a motor 30 which rotationally drives the screw rod 29.

The slidable carriage 28 includes an inner channel-like structure 28a in sliding engagement with interior surfaces of side and bottom walls of the wash liquid flow vessel 2, and an outer channel-like structure 28b in sliding engagement with exterior surfaces of the wash liquid flow vessel 2 and connected to the inner structure 28a on the top side. The first work carrier 18 is mounted on top of the inner structure 28a of the slidable carriage 28. The outer structure 28b of the slidable carriage 28 is provided with a nut member 28c in threaded engagement with the screw rod 29 which is extended on the lower side and in the longitudinal direction of the wash liquid flow vessel. Therefore, as the screw rod 29 is rotated in forward and reverse directions, the slidable carriage 28 is reciprocated in the longitudinal direction of the wash liquid flow vessel 2 between a work loading station 31 at a downstream end and a work unloading station 32 at an upstream end of the flow vessel 2.

The scrubber means 20 is located approximately in an intermediate position in the length of the flow vessel 2, and includes a support shaft 35 which is mounted on the machine frame 1 and astride of the flow vessel 2, a brush holder 36 which is fixedly mounted on the support shaft 35 and moved up and down by rotation of the support shaft 35, a transverse brush support shaft 37 which is rotatably supported on fore end portions of the brush holder 36, scrubbing brushes 38 which are mounted at uniform intervals on the transverse brush support shaft 37, a motor which is mounted fluid-tight within the brush holder 36 for rotationally driving the brush support shaft 37, and an operating mechanism 40 which moves the brush holder 36 up and down through rotation of the support shaft 35.

Alternatively, the operating mechanism 40 may be arranged either as a manual operating mechanism which is adapted to rotate the support shaft 35 manually by a handle, which is not shown, or as an automatic operating mechanism employing a motor for rotation of the support shaft 35.

Figure 5:
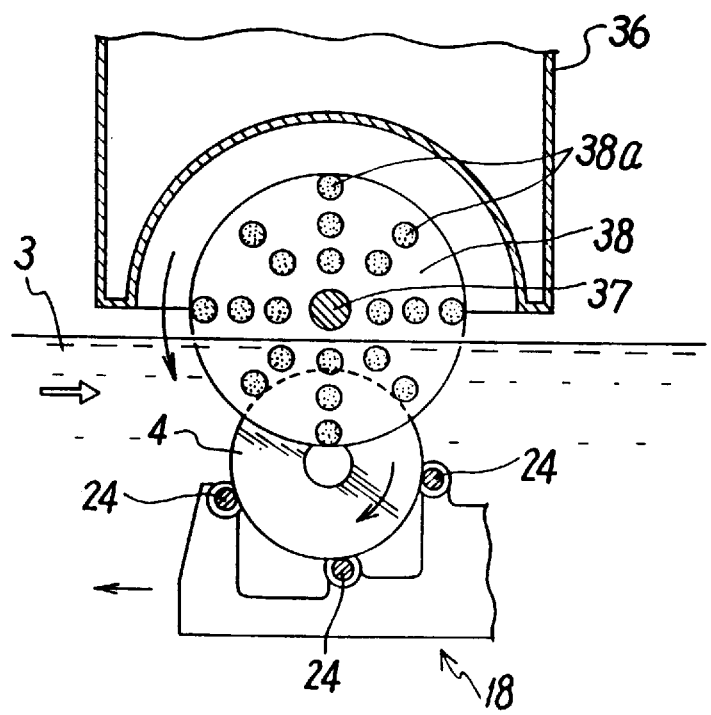
FIG. 5 is a schematic fragmentary view of the scrubber of FIG. 1 in operation for scrubbing a number work pieces.

As seen in FIGS. 4 and 5, the scrubbing brushes 38 are each provided with scrubbing pads 38a of spongy, fibrous or other flexible material with cleaning power, the scrubbing pads 38a being projected in discrete positions on opposite sides of a circular substrate of metal such as aluminum or of ceramics or synthetic resin material. The scrubbing brushes 38 are fixedly mounted on the transverse brush support shaft 37 in parallel relation with and in the same pitch as the work pieces 4 on the first work carrier 18 except for a ½ pitch shift in the axial direction relative to the positions of work pieces 4 on the carrier 18.

As the brush holder 36 is lowered, the scrubbing brushes 38 are lifted down until their lower halves are immersed in the wash liquid 3 as shown in the drawing to embrace therebetween upper halves of the flat work pieces 4 on the first carrier 18 which is being moved in a counterflow direction. While each work piece 4 is being washed and scrubbed on its opposite sides by contact with the scrubbing pads 38a on the rotating scrubbing brushes 38, it is caused to follow the rotations of the scrubbing brushes 38 by frictional forces of the scrubbing pads 38a, namely, caused to rotate in the arrowed direction by contact with the scrubbing brushes 38. Therefore, entire surfaces of each work are washed and scrubbed clean as it is passed through the scrubbing brushes 38 of the scrubber means.

Preferably, an ultrasonic irradiation means 41 is provided over the wash liquid flow vessel 2 thereby to irradiate ultrasonic waves toward the work 4 from above while the latter is being scrubbed by the brushes 38 or while being transferred through the flow vessel 2. If necessary, a plural number of ultrasonic irradiation means 41 may be provided at suitable intervals along the length of the flow vessel 2.

Further, it is desirable that the above-described scrubber means 20 be adjustable to a suitable position in the longitudinal direction of the flow vessel 2.

The scrubber means 20 may be arranged to include a work feed means for feeding unwashed work pieces to the first carrier 18 at the loading station 31, and a work ejector means for ejecting washed work pieces at the unloading station 32.

Figure 6:
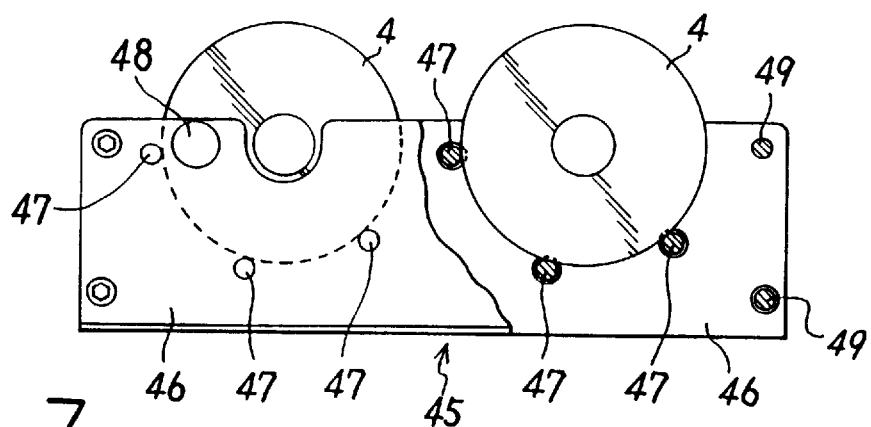
FIG. 6 is a partly cutaway side view of a second work carrier.
Figure 7:
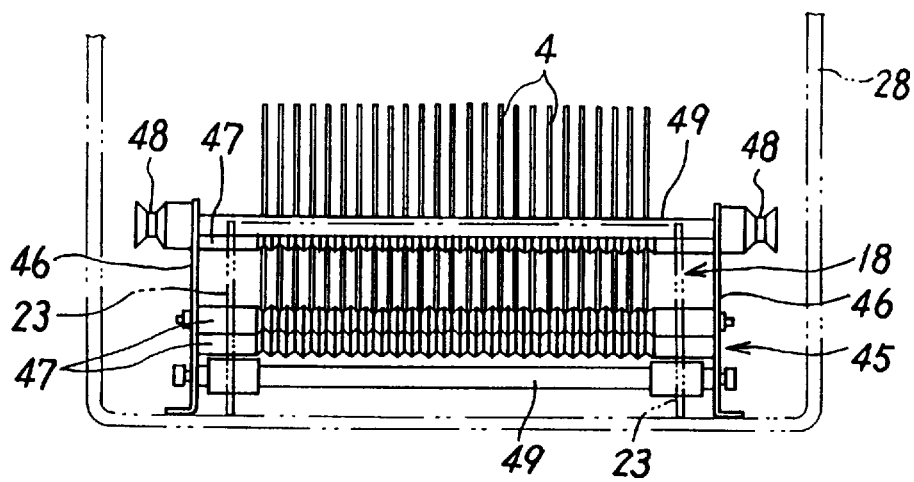
FIG. 7 is a schematic side view of the second carrier shown in FIG. 6.

In the embodiment shown in the drawings, a second work carrier 45 is arranged to serve as both of the work feed and ejector means as shown in FIGS. 6 and 7.

Figure 8:
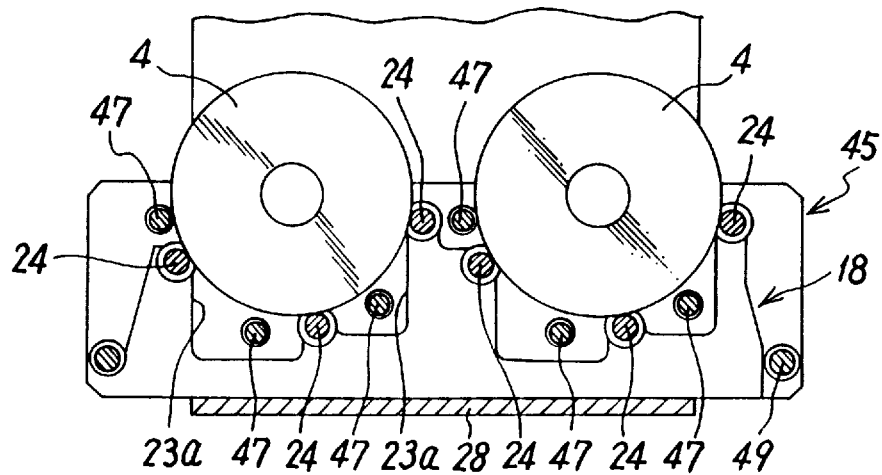
FIG. 8 is a sectional view of the first and second carriers in an overlapped state.

More specifically, as seen in FIGS. 7 and 8, the second work carrier 45 is arranged to be placed in the first work carrier 18 on the slide carriage 28 in an overlapped relation with the latter, and capable of automatically loading and unloading the work pieces 4 to and from the first carrier 18 when engaged with or disengaged from the latter as will be described in greater detail below.

Namely, the second work carrier 45 includes a pair of opposingly confronting frames 46 which are spaced from each other by such a distance as fit in and between the side frames 23 of the first work carrier 18. Fixedly mounted on these frames 46 are a plural number of transverse work holder rods 47 (three in the case of the particular embodiment shown) in vertically staggered positions in concentric relation with counter peripheries of work pieces 4 to be supported thereon. These work holder rods 47 are each provided with a plural number of circumferential grooves 47a at predetermined uniform intervals in the axial direction thereof to support work pieces 4 in upright and uniformly spaced positions by engagement with outer peripheries of the work pieces 4 at different angular positions. The circumferential grooves 47a on the work holder rods 47 of the second work carrier 45 are formed in the same positions and at the same intervals as the circumferential grooves 24a on the work holder rods 24 of the first work carrier 18.

The second work carrier 45 is provided with two sets of work holder rods 47 in its front and rear side portions in exact correspondence to the work holder rods 24 on the first work carrier 18.

In order to preclude interferences between the work holder rods of the two work carriers when engaged with each other in an overlapped state, the work holder rods 47 of the second work carrier 45 are located in angularly shifted positions around the outer peripheries of work pieces 4 and in slightly lower positions relative to the work holder rods 24 of the first work carrier 18 so that the work holder rods 47 can lie between the work holder rods 24 or vice versa in the overlapped state.

Similarly to the first work carrier 18, the second work carrier 45 is preferred to be formed of a heat- and chemical-resistant material.

Accordingly, when the second work carrier 45 loaded with a large number of flat plate-like work pieces 4 is placed in the first work carrier 18 at the loading station 31 as shown in FIGS. 7 and 8, the work holder rods 47 of the second carrier 45 are received in the spaces between the work holder rods 24 of the first carrier 18 to assume lower positions than the latter. Therefore, at this time, the work pieces 4 on the work holder rods 47 of the second carrier 45 are automatically handed over onto the work holder rods 24 of the first carrier 18. Conversely, when the second carrier 45 is lifted up at the unloading station, the work pieces 4 on the work holder rods 24 of the first carrier 18 are automatically handed over onto the work holder rods 47 of the second carrier 45 being uplifted.

The side frames 23 of the first carrier 18 are provided with notches 23a for the purpose of evading the work holder rods 47 of the second carrier 45.

In the drawings, indicated 48 are hooks for lifting the second work carrier 45 up and down at the loading and unloading stations, and at 49 is a tie rod which connects the side frames 46 of the second carrier 45.

With the scrubbing apparatus which is arranged as described above, prior to starting a scrubbing operation, the first work carrier 18 is located at the loading station 31 as shown in FIG. 1, and the brush holder 36 of the scrubber means 20 is held in an upper lifted position as indicated by chain line, with the respective scrubbing brushes 38 at rest.

Now, upon starting a scrubbing operation, the second carrier 45, which is loaded with unwashed work pieces 4, is lowered and placed in the first carrier 18 from above at the loading station 31 by operating a work loader, which is not shown. At this time, as shown in FIG. 8, the work pieces 4 on the second carrier 45 are automatically transferred onto the work holder rods 24 of the first carrier 18 and thereby supported in the wash liquid 3 in a totally submerged state parallel with the flow direction of the wash liquid.

The first and second carriers 18 and 45, which are supported on the sliding carriage 28 in an overlapped state, are transferred toward the upstream side at a predetermined speed and under the surface of the wash liquid 3. The slide carriage 28 is stopped as soon as work pieces 4 in a front row on the carrier 18 reaches a predetermined scrubbing position.

Then, the brush holder 36 of the scrubber means 20 is lowered to the position of FIG. 5 by a semi-automatic or manual operation to dip the lower halves of the respective scrubbing brushes 38 in the wash liquid 3 in such a way as to embrace upper halves of the work pieces 4 between the submerged lower halves of the scrubbing brushes 38. By rotation of the scrubbing brushes 38, the work pieces 4 are turned about the respective axis and scrubbed all over in the flow of the wash liquid 3. At this time, preferably ultrasonic waves are radiated toward the work pieces 4 from the ultrasonic irradiation means 41 to implement the cleaning effects on the work pieces 4.

In this connection, the scrubbing brushes 38 are preferred to be rotated in the flow direction of the wash liquid as indicated by an arrow in FIG. 5 for lessening agitation and splashing of the wash liquid by the scrubbing brushes 38 and for letting once-removed contaminants be quickly carried away to the downstream side entrained on the flow of the wash liquid.

While undergoing scrubbing by frictional contact with the scrubbing pads 38a, the work pieces 4 are caused to rotate following the rotational movements of the scrubbing brushes 38 and thereby washed clean on their entire surfaces.

Upon finishing a cycle of scrubbing operation for the work pieces 4 in a front row, the two carriers 18 and 45 are moved forward together with the sliding support member 28 over a predetermined distance to locate the work pieces in a rear row at the scrubbing position. The work pieces 4 in the rear row are scrubbed in the same manner as the above-described scrubbing operation on the front row of work pieces 4.

Upon completing the scrubbing cycles for all of the work pieces 4, the carriers 18 and 45 on the slidable carriage 28 are further advanced as far as the unloading station 32, while stopping rotation of the scrubbing brushes 38 and uplifting the scrubber means 20 into an upper standby position.

As soon as the two carriers 18 and 45 reach the unloading station 32, the second carrier 45 alone is lifted up out of the flow vessel 2 by an unloader which is not shown. At this time, the washed work pieces 4 on the first carrier 18 are automatically picked up on the work holder rods 47 of the second carrier 45 and thereby ejected out of the flow vessel.

After ejection of the second carrier 45 and the scrubbed work pieces 4, the first carrier 18 is returned to the loading station 31 by the transfer means 19 to receive another second carrier 45, which is loaded with unwashed work pieces, and fed forward again to repeat the above-described operations.

The carrier transfer speed of the slidable carriage 28 and the rotational speed of the scrubbing brushes are controlled in optimum ranges which vary depending upon the nature of work pieces, the velocity and kind of the wash liquid and so forth, but the carrier transfer speed is preferred to be approximately in the range of 5 mm/sec to 20 mm/sec and the rotational speed of the scrubbing brushes is preferred to be approximately in the range of 10 to 100 r.p.m. and more preferably in the range of 30 to 45 r.p.m.

While scrubbing work pieces in a totally submerged state in the flow of wash liquid as described above, fresh wash liquid is constantly fed to the scrubbing position in a sufficient amount so that deposited contaminants on work pieces can be washed and scrubbed off in an extremely efficient manner. Besides, removed contaminants are continuously carried away to the downstream side of the flow vessel, entrained on the flow of the wash liquid, and are completely prevented from re-depositing on work pieces or on the scrubbing brushes in a reliable manner.

Besides, there is no possibility of the wash liquid being splashed and scattered around to impair the working environment around the flow vessel. Namely, clean and safe working environment can be maintained without providing a hood or other enclosure which would otherwise be necessitated for blocking splashes of the wash liquid.

Further, since flat plate-like work pieces and scrubbing brushes 38 are positioned parallel with the streams of the wash liquid 3 in the scrubbing and transfer stages of the operation, the resistance of the wash liquid can be reduced to a minimum in transferring work pieces and rotating the scrubbing brushes 38 in the wash liquid. As a consequence, it becomes possible to carry out the work transfer and scrubbing operations quite smoothly in the flow vessel, that is to say, to carry out the above-described submerged scrubbing operations easily under stabilized conditions.

The carriers 18 and 45 which are stopped at an intermediate scrubbing position in the foregoing embodiment may be moved continuously to pass through the scrubber means 20 at a low speed if desired.

Further, in the foregoing embodiment, the scrubbing brushes 38 are retained in an upper receded position and lowered to the half-immersed operative position as soon as the carriers 18 and 45 reach the intermediate scrubbing position. However, the scrubbing brushes 38 may be set in the lower operative position before the arrival of the carriers 18 and 45, or alternatively may be continuously held in the lower operative position until finishing scrubbing operations for all of work pieces.

Moreover, instead of using a number of similar second carriers 45 as work loading and unloading means which operate in cooperation with the first carrier 18, arrangements may be made to lift the first work carrier 18 itself up and down relative to the slidable carriage 28 to serve also as work loading and unloading means. In such a case, hanger hooks or other parts which are necessary for lifting operations are attached to the first work carriage 18.

Furthermore, the scrubbing brushes 38 which are operated in a half-immersed state in the above-described embodiment may be fully immersed in the flow of wash liquid at the time of scrubbing operation if desired.

It is to be understood that, besides the horizontal flow type vessel 2 which is shown in the drawings, the fundamental concept of the present invention encompasses other types of flow vessels in its scope, for example, an overflow type vessel in which a wash liquid is continuously flown from bottom to top side of the vessel and allowed to overflow at the top ends of vessel walls while work pieces are scrubbed in upward streams of the wash liquid.

As clear from the foregoing description, the present invention makes it possible to scrub and wash away contaminants from flat work pieces efficiently in an assured manner by scrubbing work pieces in an immersed state in a flow of a wash liquid, constantly supplying a sufficient amount of fresh wash liquid toward the work pieces being scrubbed to wash away scrubbed contaminants by entrainment on the flow of wash liquid and to prevent re-deposition on work pieces.

Besides, the present invention contributes to realize splash-free safe and clean scrubbing operations without resorting to a hood or other splash guard enclosure to block splashes of wash liquid which would impair the working environment around the scrubbing apparatus to a considerable degee.

What is claimed is:

1. An apparatus for scrubbing flat plate-like work pieces in a running wash liquid, said apparatus comprising:
    a channel-like wash liquid flow vessel for maintaining a flow of a wash liquid in one direction;
    a work holder means for holding said work pieces immersed in said wash liquid in the flow vessel such that at least one substantially planar face of the work pieces is in parallel relation with the flow direction of said wash liquid, said work holder means arranged to hold said work pieces rotatably about their respective axes; and
    a scrubber means located in a predetermined position on the flow vessel and provided with scrubbing brushes to scrub said work pieces in an immersed state in the flow of said wash liquid, said scrubbing brushes having a circular and flat disc-like shape and being disposed in said flow vessel in parallel relation with said work pieces and the flow direction of said wash liquid.

2. An apparatus as defined in claim 1, wherein said wash liquid is flown horizontally through said flow vessel, and said work holder means is supported so as to transfer said work pieces through the flow vessel in a direction reverse to the flow direction of said wash liquid.

3. An apparatus as defined in claim 2, further comprising an ultrasonic radiation means to radiate ultrasonic waves toward said work pieces in said flow vessel.

4. An apparatus as defined in any one of claims 1 and 2, further comprising an ultrasonic radiation means to radiate ultrasonic waves toward said work pieces in said flow vessel.

5. An apparatus for scrubbing flat disc-like work pieces in a running wash liquid, said apparatus comprising:
    a wash liquid flow vessel for maintaining a continuous flow of a wash liquid horizontally in one direction;
    a first work carrier movable back and forth in and along the length of said flow vessel and arranged to hold a plural number of circular disc-like work pieces rotatably about their respective axes and in parallel relation with the flow direction of said wash liquid;
    a counterflow transfer means for transferring said first work carrier and said work pieces in and along said flow vessel in a direction reverse to the flow direction of said wash liquid;
    a scrubber means located in an intermediate position on said flow vessel and provided with a brush holder having a plural number of circular disc-like scrubbing brushes in uniformly spaced positions in a transverse direction across said flow vessel to scrub said work pieces on said first carrier immersed in the flow of the wash liquid;
    a work feeder means located at a loading station downstream of said scrubber means for feeding unwashed work pieces to said first carrier; and
    a work ejector means located at an unloading station upstream of said scrubber means to eject washed work pieces from said first carrier.

6. An apparatus as defined in claim 5, wherein said first carrier is provided with a plural number of transversely extending parallel work holder rods rotatably supported in vertically staggered positions and each formed with circumferential grooves at uniform intervals in the transverse direction to hold said work pieces in upright and uniformly spaced positions by engagement with outer peripheries of said work pieces at a number of different angular positions, and said work feeder means and said work ejector means are provided in a second work carrier having a plural number of transversely extending parallel work holder rods each formed with a plural number of circumferential grooves at uniform intervals in the transverse direction to hold a number of work pieces in upright positions by engagement with outer peripheries of said work pieces at number of shifted angular positions relative to the work holder rods of the first carrier, said second carrier being movable toward and away from said first carrier in said flow vessel and arranged to load unwashed work pieces onto said work holder rods of said first carrier when placed in the latter in an overlapped state and to eject washed work pieces on said work holder rods of said first carrier when uplifted to disengage therefrom.

\* \* \* \* \*